(12) United States Patent
Chen et al.

(10) Patent No.: US 9,915,763 B2
(45) Date of Patent: Mar. 13, 2018

(54) STACKED-LENS ASSEMBLY AND FABRICATION METHOD FOR SAME

(71) Applicant: OmniVision Technologies, Inc., Santa Clara, CA (US)

(72) Inventors: Wei-Ping Chen, New Taipei (TW); Tsung-Wei Wan, HsinChu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/941,174

(22) Filed: Nov. 13, 2015

(65) Prior Publication Data

US 2017/0139086 A1    May 18, 2017

(51) Int. Cl.

| G02B 9/04 | (2006.01) |
|---|---|
| G02B 3/00 | (2006.01) |
| B32B 37/12 | (2006.01) |
| G02B 13/00 | (2006.01) |
| G03B 17/12 | (2006.01) |
| H01L 27/146 | (2006.01) |

(52) U.S. Cl.
CPC ............ *G02B 3/0062* (2013.01); *B32B 37/12* (2013.01); *G02B 3/0031* (2013.01); *G02B 13/0085* (2013.01); *G03B 17/12* (2013.01); *H01L 27/14627* (2013.01); *H01L 27/14632* (2013.01); *H01L 27/14643* (2013.01); *H01L 27/14685* (2013.01); *H01L 27/14687* (2013.01); *B32B 2551/00* (2013.01)

(58) Field of Classification Search
CPC ........................................ G02B 3/0062
USPC ................................. 359/793, 811
See application file for complete search history.

(56) References Cited

U.S. PATENT DOCUMENTS

| 2011/0037887 A1 | 2/2011 | Lee et al. | |
| 2012/0200946 A1* | 8/2012 | Wippermann | G02B 7/028 359/811 |
| 2014/0204467 A1 | 7/2014 | Hsiao et al. | |

* cited by examiner

*Primary Examiner* — James Jones
(74) *Attorney, Agent, or Firm* — Lathrop Gage LLP

(57) ABSTRACT

A stacked-lens assembly includes a lower substrate and an upper substrate. The lower substrate includes a lower-substrate top surface having thereon a lower element and an inner spacer, the inner spacer at least partially surrounding the lower element. The upper substrate includes an upper-substrate bottom surface opposite the lower-substrate top surface and having thereon an upper element and an outer spacer, the outer spacer (i) being attached to the inner spacer and (ii) at least partially surrounding the upper element. In any cross-section of the stacked-lens assembly parallel to the upper substrate and including both the inner spacer and the outer spacer, the entirety of the inner spacer is within a perimeter of the outer spacer.

17 Claims, 12 Drawing Sheets

STACKED-LENS ASSEMBLY AND FABRICATION METHOD FOR SAME

BACKGROUND

Wafer-level manufacture of camera modules manufactured with complementary metal-oxide semiconductor (CMOS) technologies has contributed to the incorporation of camera modules in high-volume consumer products such as mobile devices and motor vehicles.

FIG. 1 shows a wafer-level lens 100 incorporated into a camera module 192 of a mobile device 190. FIG. 2 is a cross-sectional view of a prior-art lens assembly 200 that is an example of wafer-level lens 100. Lens assembly 200 includes a lower substrate 210 and an upper substrate 240 separated by a spacer ring 230. Upper substrate 240 includes an upper lens 242 that is axially aligned to a lower lens 212 on lower substrate 210.

Lower substrate 210 and an upper substrate 240 include alignment structures 251 and 252 respectively. Lower lens 212 and upper lens 242 include alignment structures 253 and 254 respectively. Alignment structures 251-254 are used to ensure axial alignment of lenses 212 and 242 during fabrication of lens assembly 200. A drawback of lens assembly 200 is that incorporating alignment structures 251-254 into substrates 210, 240 and lenses 212, 242 adds manufacturing costs and complexity.

SUMMARY OF THE INVENTION

In one embodiment, a stacked-lens assembly is disclosed. The stacked-lens assembly includes a lower substrate and an upper substrate. The lower substrate includes a lower-substrate top surface having thereon a lower element and an inner spacer, the inner spacer at least partially surrounding the lower element. The upper substrate includes an upper-substrate bottom surface opposite the lower-substrate top surface and having thereon an upper element and an outer spacer, the outer spacer (i) being attached to the inner spacer and (ii) at least partially surrounding the upper element. In any cross-section of the stacked-lens assembly parallel to the upper substrate and including both the inner spacer and the outer spacer, the entirety of the inner spacer is within a perimeter of the outer spacer.

In another embodiment, a stacked-lens wafer is disclosed. The stacked-lens wafer includes a lower wafer and an upper wafer. The lower wafer includes a lower-wafer top surface having thereon (i) a plurality of lower elements and (ii) a lower spacer layer having (a) a plurality of apertures aligned with one respective lower element, and (b) a channel between each adjacent aperture and at least partially surrounding each aperture. The upper wafer includes an upper-wafer bottom surface opposite the lower-wafer top surface and having thereon (i) a plurality of upper elements and (ii) an upper spacer layer having a plurality of apertures each aligned with one respective upper element. The upper wafer and the lower wafer are attached such that at least a portion of the upper spacer layer is within the channel.

In another embodiment, a method for fabricating a stacked-lens assembly is disclosed. A method includes forming, on a lower wafer, a lower spacer layer having (a) a plurality of apertures aligned with a respective one of a plurality of lower elements on the lower wafer, and (b) a channel between each adjacent aperture and at least partially surrounding each aperture. The method also includes forming an upper spacer layer having a plurality of apertures each aligned with a respective one of a plurality of upper elements on the upper wafer. The method also includes stacking the upper wafer to the lower wafer such that at least a portion of the upper spacer layer is within the channel.

DETAILED DESCRIPTION OF THE EMBODIMENTS

Figure 1:
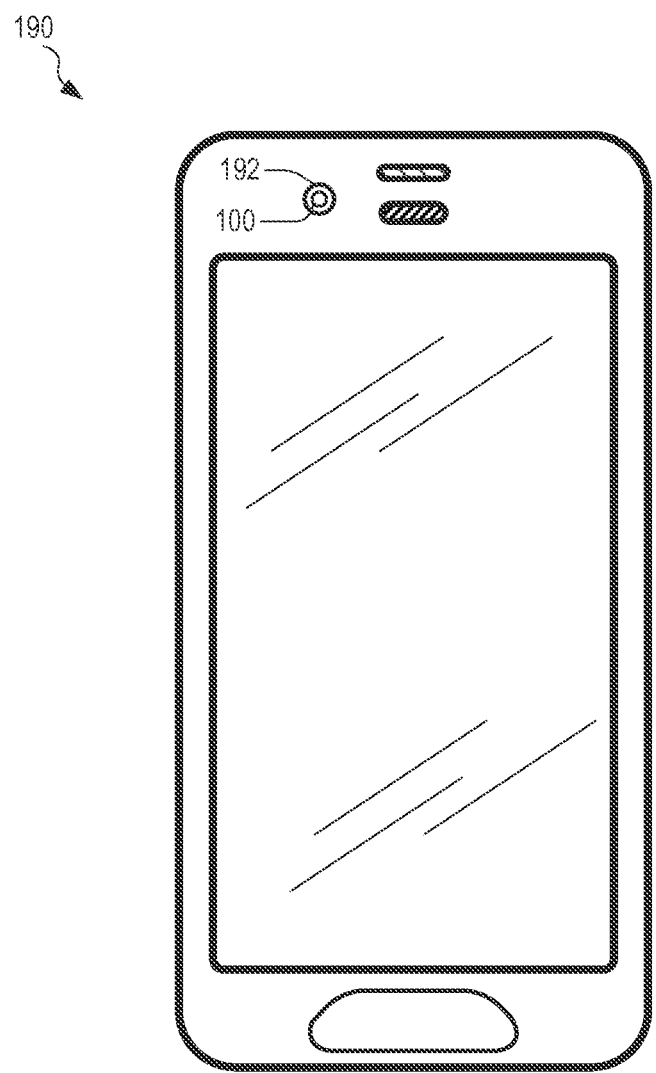
FIG. 1 shows a wafer-level lens incorporated into a camera module of a mobile device.
Figure 2:
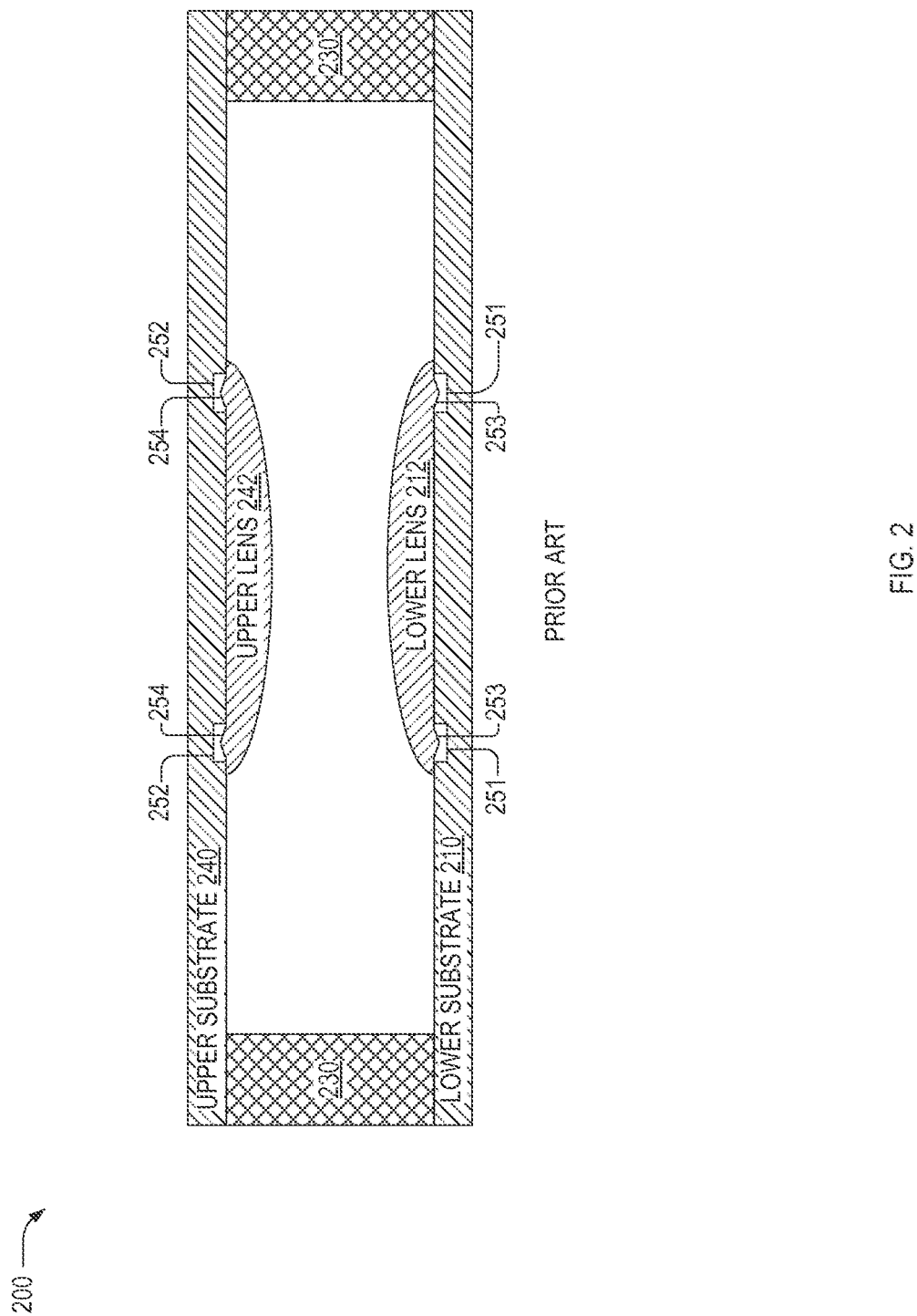
FIG. 2 is a cross-sectional view of a prior-art lens assembly that is an example of the wafer-level lens of FIG. 1.
Figure 3A:
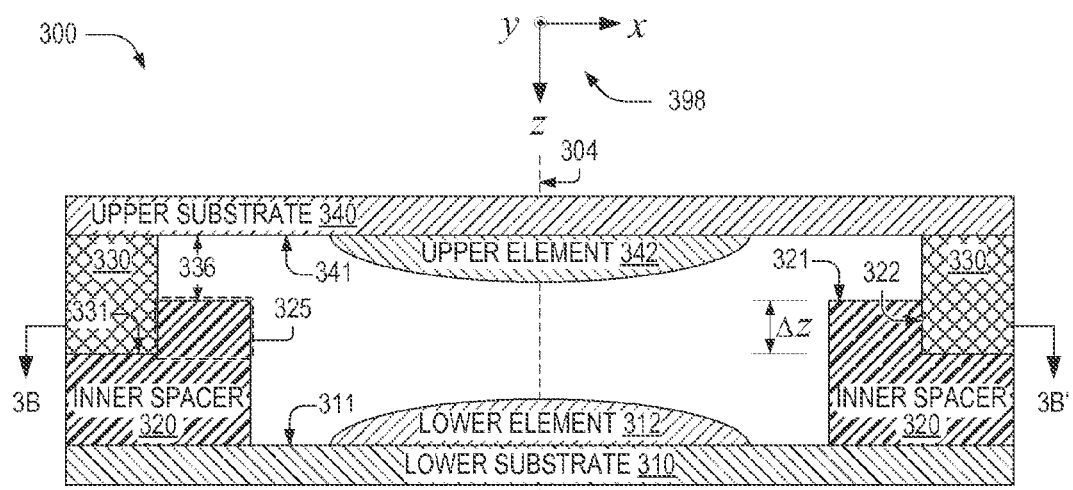
FIGS. 3A and 3B each show a cross-sectional view of a stacked-lens assembly that may function as the wafer-level lens of FIG. 1, in an embodiment.
Figure 3B:
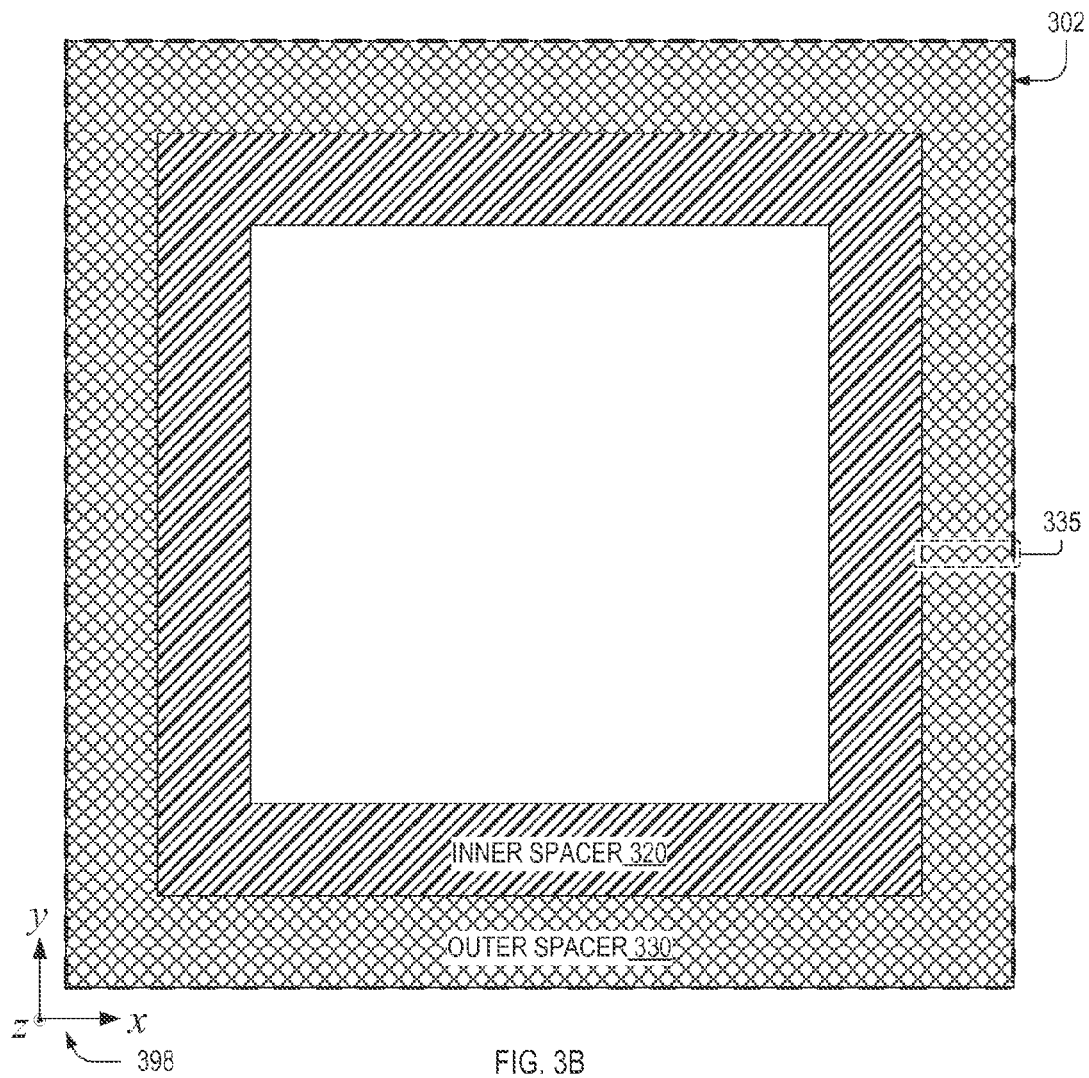
Figure 4A:
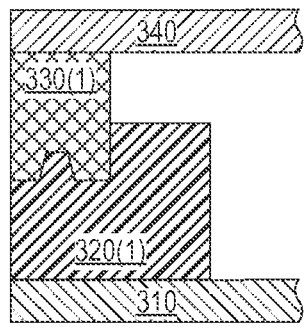
FIGS. 4A-4E show alternative cross-sectional views of inner spacers and outer spacers of the stacked-lens assembly of FIG. 3, in an embodiment.
Figure 4B:
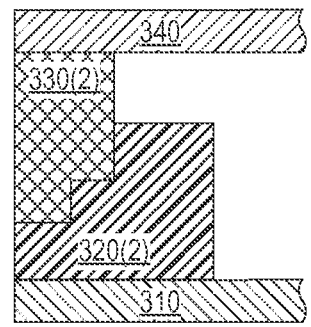
Figure 4C:
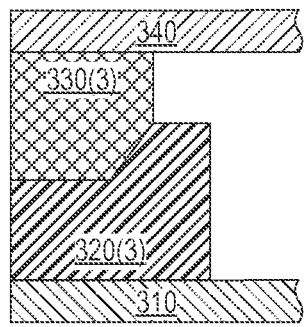
Figure 4D:
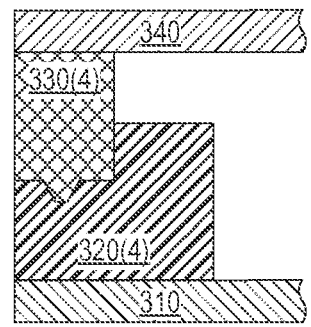
Figure 4E:
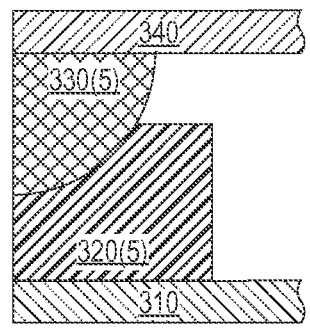

FIG. 3A is a first cross-sectional view of a stacked-lens assembly 300 that may function as wafer-level lens 100 in mobile device 190. FIG. 3B is a second cross-sectional view of stacked-lens assembly 300 along cross-section 3B-3B' shown in FIG. 3A. Referring to a coordinate system 398 shown in FIGS. 3A and 3B, the views of FIGS. 3A and 3B are in the x-z plane and x-y plane respectively. Cross-section 3B-3B' may be anywhere in a region denoted by z-coordinate range $\Delta z$ such that it intersects both inner spacer 320 and outer spacer 330. FIGS. 3A and 3B are best viewed together in the following description.

Stacked-lens assembly 300 includes a lower substrate 310 and an upper substrate 340 with an inner spacer 320 and outer spacer 330 therebetween. Lower substrate 310 has an upper surface 311 with a lower element 312 thereon. Upper substrate 340 has a lower surface 341 with an upper element 342 thereon. Outer spacer 330 is attached to inner spacer 320 along at least one of a surface 322 and a surface 331. Inner spacer 320 includes a first sidewall 325. Lower surface 341 and a top surface 321 of inner spacer 320 are separated by a gap 336.

Inner spacer 320 surrounds lower element 312 and outer spacer 330 surrounds upper element 342. Without departing from the scope hereof, at least one of (a) inner spacer 320 may partially surround lower element 312 and (b) outer spacer 330 may partially surround upper element 342.

Outer spacer 330 has a perimeter 302, shown in FIG. 3B as a dashed line. Outer spacer 330 surrounds inner spacer 320 and the entirety of inner spacer 320 is within perimeter 302. Outer spacer 330 may partially surround inner spacer 320 without departing from the scope hereof. For example, outer spacer 330 may include a gap in a region, such as region 335 shown in FIG. 3B.

Inner spacers 320 and outer spacer 330 are shown having a square cross-section in FIG. 3B. Spacers 320 may have non-circular cross-sections (in cross-section 3B-3B') without departing from the scope hereof. For example, at least one of spacers 320 and 330 may be circular, or rectangular with rounded corners.

At least one of lower element 312 and upper element 342 may be a lens. For example, as shown in FIG. 3A, lower element 312 and upper element 342 are each lenses having a common optical axis 304, and both lower substrate 310 and upper substrate 340 are transparent. In a different embodiment, upper element 342 is a lens and lower substrate 310 is a device layer having lower element 312 formed thereon, where lower element 312 is an image sensor, such as a CMOS image sensor. In a different embodiment, lower element 312 is a lens and upper substrate 340 is a device layer having upper element 342 formed thereon, where upper element 342 is an image sensor, such as a CMOS image sensor.

In the x-z plane of coordinate system 398, inner spacer 320 may have an L-shaped cross-section and outer spacer 330 may have a rectangular cross-section, as shown in FIG. 3A. Spacers 320 and 330 may have different cross-sections, examples of which are shown in FIGS. 4A-4E which show cross-sectional views of inner spacers 320(1-5) and outer spacers 330(1-5).

Figure 5:
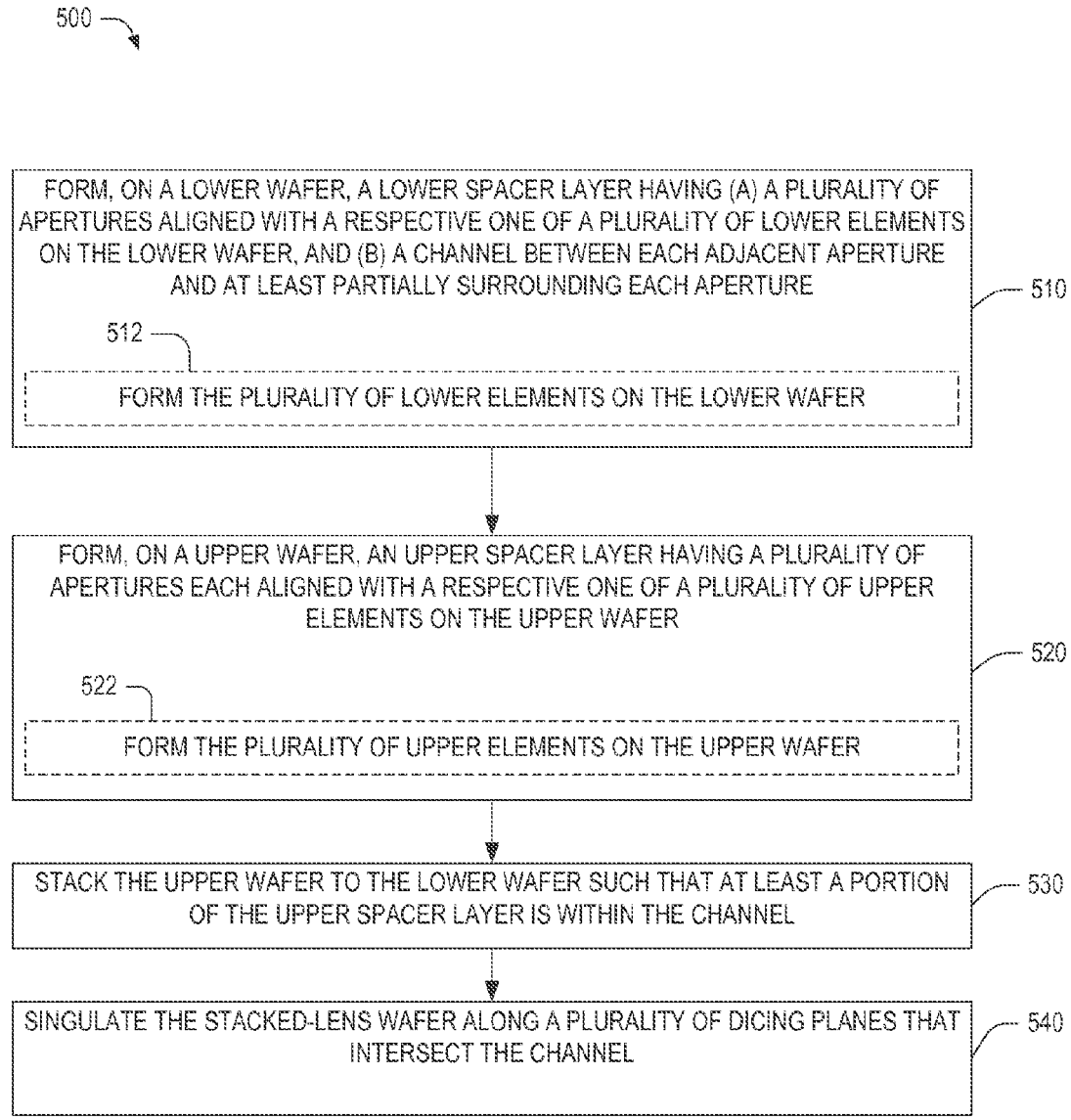
FIG. 5 is a flowchart illustrating an exemplary method for fabricating the stacked-lens assembly of FIG. 3, in an embodiment.

FIG. 5 is a flowchart illustrating an exemplary method 500 for fabricating a stacked-lens assembly 300. FIGS. 5-12 illustrate steps of method 500 and are best viewed together with the following description.

Figure 6A:
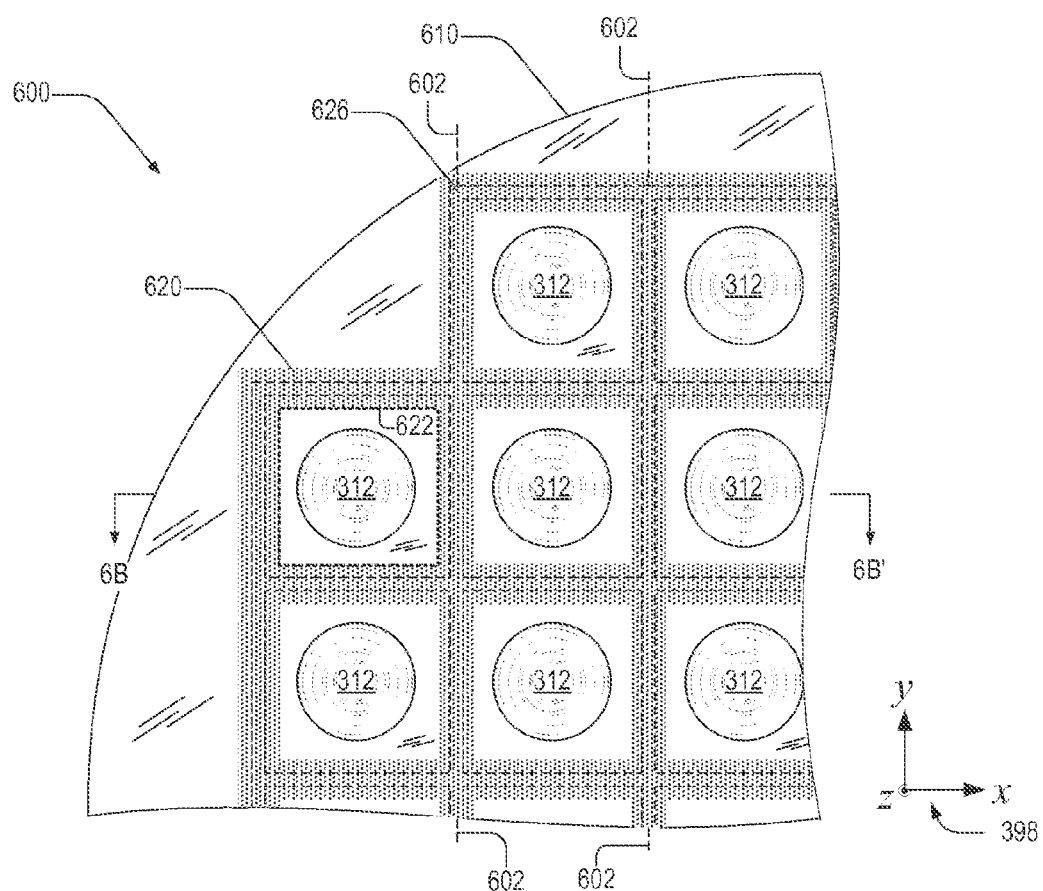
FIGS. 6A and 6B show cross-sectional views of a first lower wafer assembly that includes elements and spacers of the stacked-lens assembly of FIG. 3, in an embodiment.
Figure 6B:
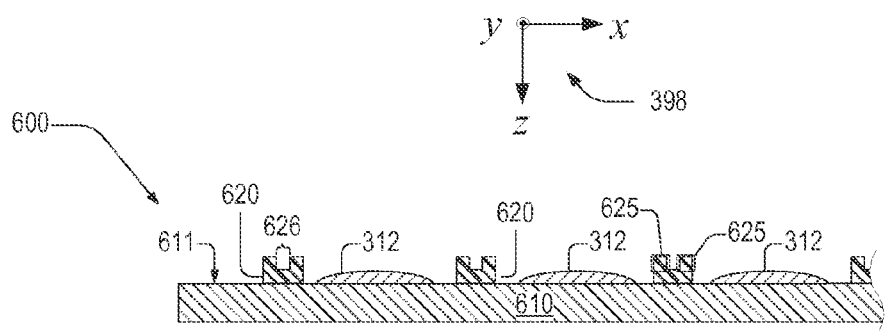

In step 510, method 500 forms, on a lower wafer, a lower spacer layer having (a) a plurality of apertures aligned with a respective one of a plurality of lower elements on the lower wafer, and (b) a channel between each adjacent aperture and at least partially surrounding each aperture. In an example of step 510, a lower spacer layer 620 is formed on surface 611 of a lower wafer 610, as shown in a plan view and a cross-sectional view of a lower wafer assembly 600 in FIGS. 6A and 6B, respectively. FIG. 6B is a cross-sectional view of lower wafer assembly 600 along cross-section 6B-6B'.

A plurality of lower elements 312 are on surface 611 of lower wafer 610. Lower spacer layer 620 has a plurality of apertures 622 each aligned with a one respective lower element 312. For clarity of illustration, only one aperture 622 is labelled (by its perimeter), in FIG. 6A.

Lower spacer layer 620 includes sidewalls 625, shown in FIG. 6B, that form a channel 626. Channel 626 individually surrounds each aperture 622 and includes portions between adjacent apertures 622. Dashed lines in FIG. 6A represent surfaces of sidewalls 625 the define channel 626.

Channel 626 is shown as a single continuous channel within lower spacer layer 620 that completely surrounds each aperture 622. Channel 626 may partially surround one or more apertures 622 without departing from the scope hereof. In an embodiment, lower spacer layer 620 includes multiple noncontiguous channels 626 that each surround a respective aperture 622.

Figure 7:
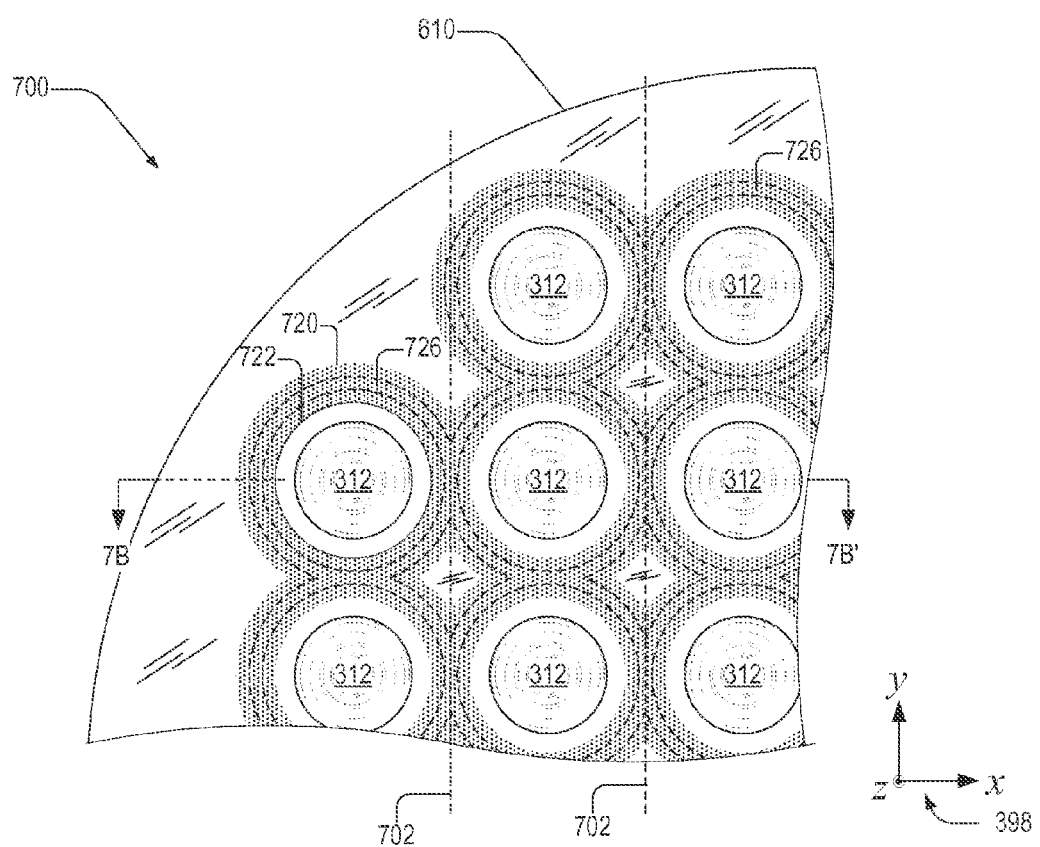
FIG. 7 is a plan view of a second lower wafer assembly that includes components of the stacked-lens assembly of FIG. 3, in an embodiment.

While apertures 622 are rectangular in the x-y plane of coordinate system 398, they may be non-rectangular without departing from the scope hereof. For example, FIG. 7 is a plan view of a wafer assembly 700 that includes lower wafer 610 with a lower spacer layer 720 thereon. Wafer assembly 700 is an example of lower wafer assembly 600. Spacer layer 720 has apertures 722 each aligned with a lower element 312. Spacer layer 720 also includes a channel 726, which is an example of channel 626. FIG. 6B may also correspond to a cross-sectional view of wafer assembly 700 along cross-section 7B-7B' of FIG. 7. For clarity of illustration, only one aperture 722 is labelled (by its perimeter), in FIG. 7.

While apertures 722 are shown to be circular, they may be non-circular without departing from the scope hereof. For example, apertures 722 may be rectangular with rounded corners.

Step 510 may optionally include step 512, in which method 500 forms the plurality of lower elements on the lower wafer. In an example of step 512, lower elements 312 are formed on surface 611 of lower wafer 610.

Lower elements 312 may be simultaneously formed on surface 611 by a wafer-level replication process known in the art. Lower elements 312 and lower spacer layer 620 may be formed on surface 611 simultaneously from a single replication master containing molds that form both lower elements 312 and lower spacer layers such as lower spacer layer 620 and 720, as shown in FIG. 8.

Figure 8:
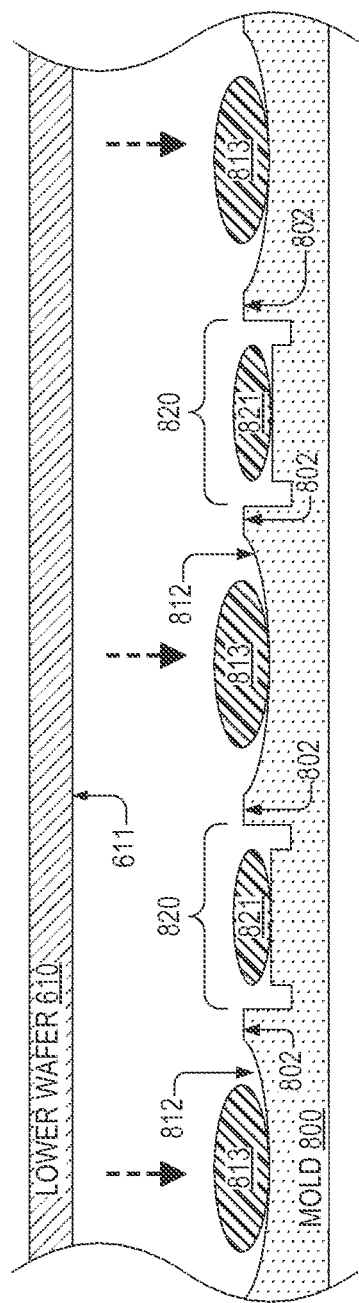
FIG. 8 is a cross-sectional view of a mold used to form elements and lower spacer layer on the lower wafer of FIG. 6 or 7, in an embodiment.

FIG. 8 is a cross-sectional view of a mold 800 used to form lower elements 312 and lower spacer layer 620 on lower wafer 610 when lower element 312 is a wafer-level optical element, such as a lens. Mold 800 has a top surface that includes planar regions 802, recesses 812, and recesses 820. Recesses 812 and 820 correspond to the shape of lower elements 312 and lower spacer layer 620 respectively. In an example of step 510, material portions 813 and 821 are deposited into recesses 812 and recesses 820 and then molded into shapes of lower elements 312 and lower spacer layer 620, respectively, by joining planar regions 802 with surface 611 of lower wafer 610. Material portions 813 and 821 may be photo-curable materials (e.g., by ultraviolet light), such that step 510 also includes curing material portions 813 and 821.

Figure 9A:
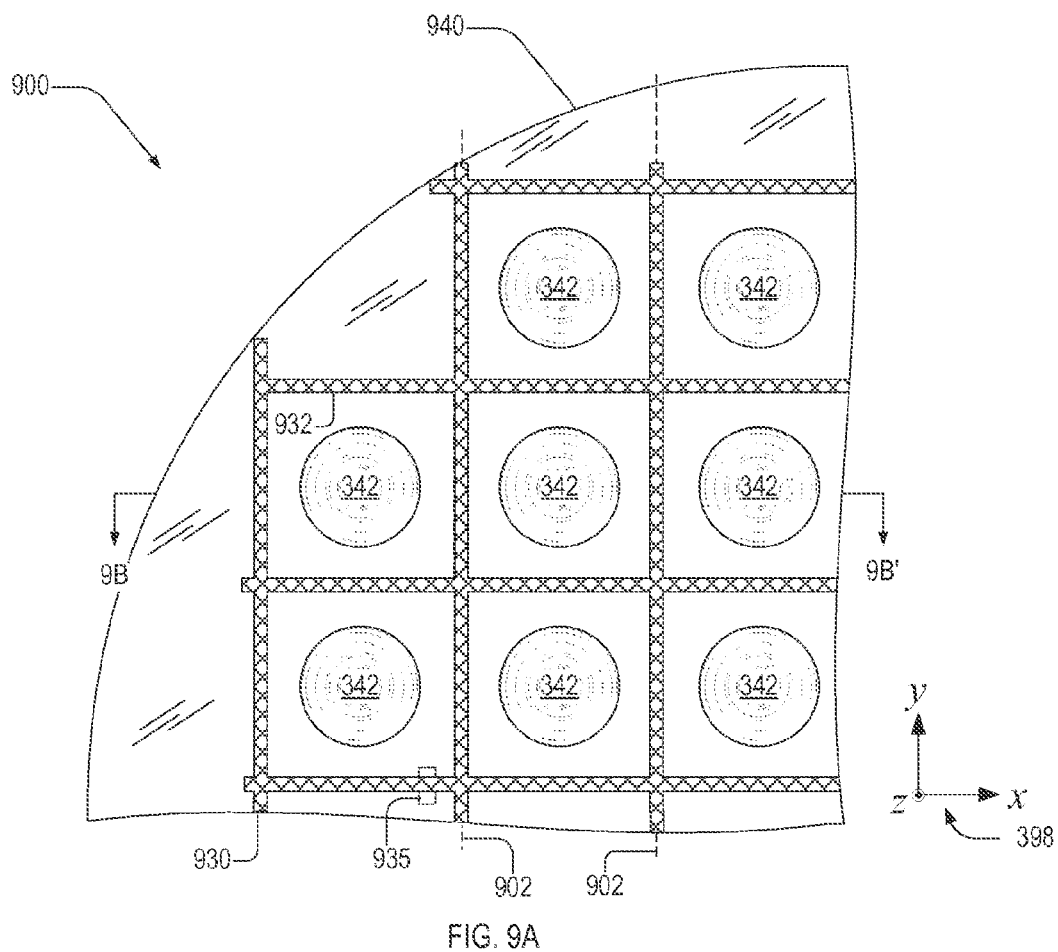
FIGS. 9A and 9B show a plan view and a cross-sectional view, respectively, of a first upper wafer assembly that includes elements and spacers of the stacked-lens assembly of FIG. 3, in an embodiment.
Figure 9B:
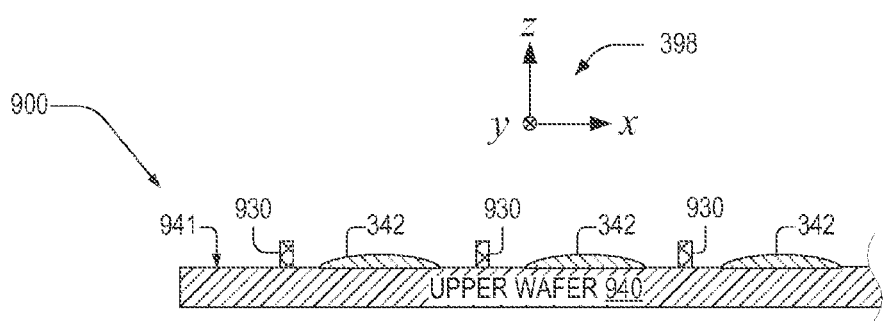

In step 520, method 500 forms, on an upper wafer, an upper spacer layer having a plurality of apertures each aligned with a respective one of a plurality of upper elements on the lower wafer. In an example of step 510, an upper spacer layer 930 is formed on a surface 941 of an upper wafer 940, as shown in a plan view and a cross-sectional view of an upper wafer assembly 900 in FIGS. 9A and 9B, respectively. FIG. 9B is a cross-sectional view of upper wafer assembly 900 along cross-section 9B-9B'.

Figure 10:
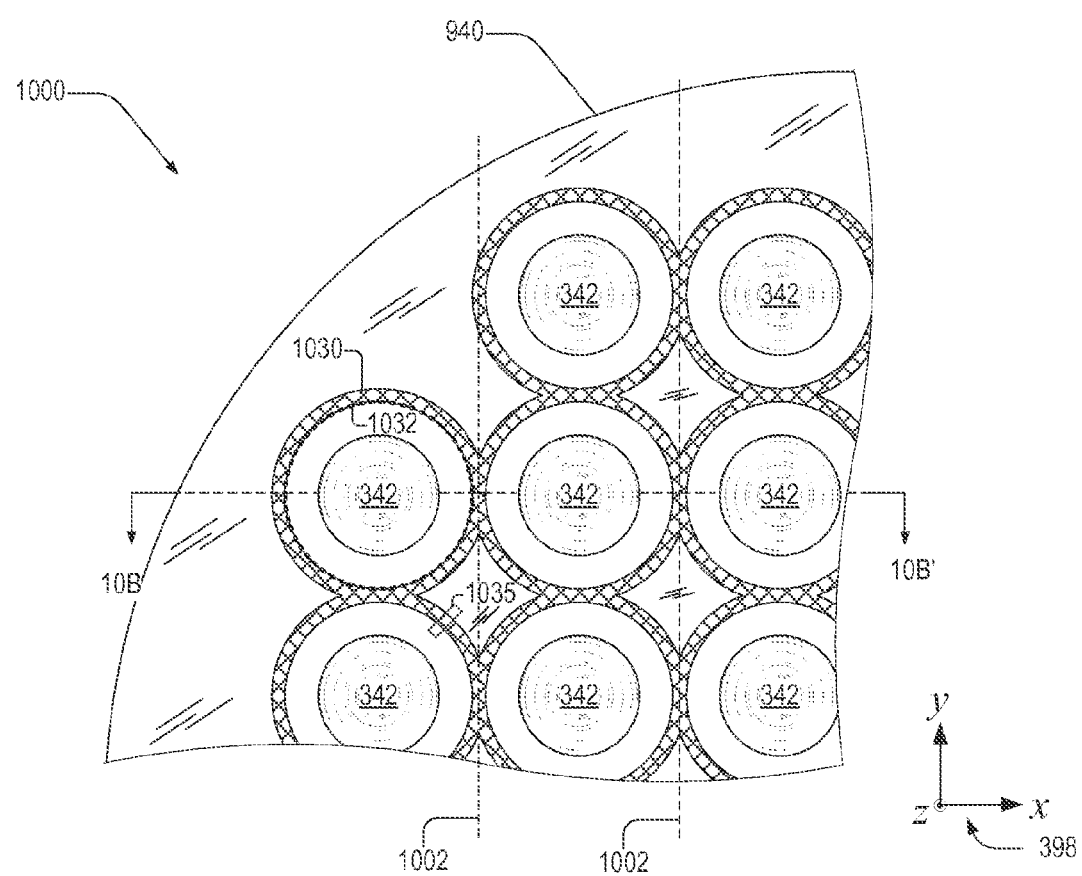
FIG. 10 is a plan view of a second upper wafer assembly that includes components of the stacked-lens assembly of FIG. 3, in an embodiment.

A plurality of upper elements 342 are on surface 941 of upper wafer 940. Upper spacer layer 930 has a plurality of apertures 932 each aligned with a one respective upper element 342. For clarity of illustration, only one aperture 932 is labelled (by its perimeter), in FIG. 9A. While apertures 932 are rectangular in the x-y plane of coordinate system 398, they may be non-rectangular without departing from the scope hereof. For example, FIG. 10 is a plan view of an upper wafer assembly 1000 that includes upper wafer 940 with an upper spacer layer 1030 thereon. Upper wafer assembly 1000 is an example of upper wafer assembly 900. Spacer layer 1030 has apertures 1032 each aligned with one upper element 342. FIG. 9B may also correspond to a cross-sectional view of upper wafer assembly 1000 along cross-section 10B-10B' of FIG. 10. For clarity of illustration, only one aperture 1032 is labelled (by its perimeter), in FIG. 10.

While apertures 1032 are shown to be circular, they may be non-circular without departing from the scope hereof. For example, apertures 1032 may be rectangular with rounded corners. One or both of upper spacer layers 930 and 1030 may include a gap in a region, such as in regions 935 and 1035 respectively.

Herein, alignment of an aperture of a spacer layer on a wafer to an element on the wafer means that no part of the spacer layer covers or obstructs the element. For example, alignment of an aperture 932 to an upper element 342 means that no part of upper spacer layer 930 covers or obstructs the upper element 342. Aperture 932 and an upper element 342 may have their respective centers aligned, but such center-to-center alignment is not required for aperture 932 to be aligned to an upper element 342. Other examples of apertures include apertures 622, 722, and 1032. Other examples of elements include lower elements 312 and upper elements 342.

Step 520 may optionally include step 522, in which method 500 forms the plurality of upper elements on the upper wafer. In an example of step 522, upper elements 342 are formed on bottom surface 941 of upper wafer 940.

Upper elements 342 may be simultaneously formed on bottom surface 941 by a wafer-level replication process known in the art. Upper elements 342 and upper spacer layer 930 may be formed on bottom surface 941 simultaneously from a single replication master containing molds that form both upper elements 342 and upper spacer layer such as upper spacer layer 930 and 1030, as shown in FIG. 11.

Figure 11:
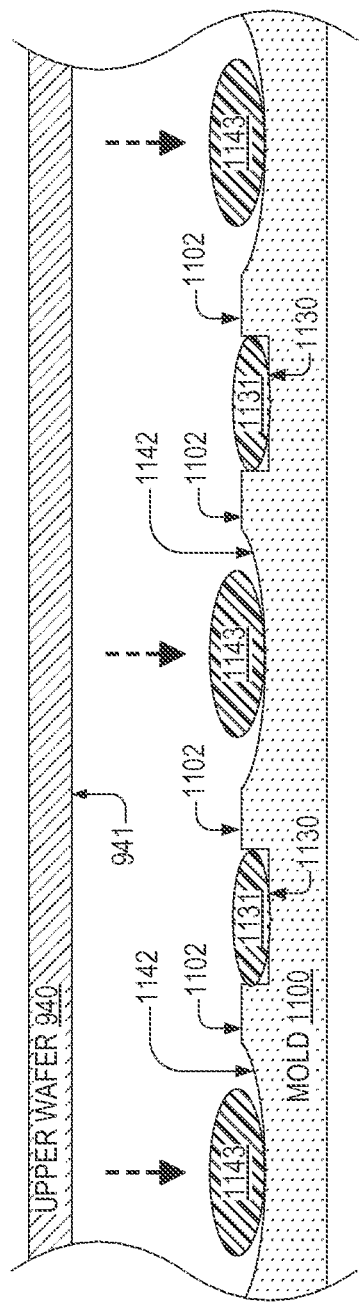
FIG. 11 is a cross-sectional view of a mold used to form elements and upper spacer layer on the upper wafer of FIG. 9, in an embodiment.

FIG. 11 is a cross-sectional view of a mold 1100 used to form upper elements 342 and upper spacer layer 930 on upper wafer 940 when upper element 342 is a wafer-level optical element, such as a lens. Mold 1100 has a top surface that includes planar regions 1102, recesses 1142, and recesses 1130. Recesses 1142 and 1130 correspond to the shape of upper elements 342 and upper spacer layer 930 respectively. In an example of step 520, material portions 1143 and 1131 are deposited into recesses 1142 and recesses 1130 and then molded into shapes of upper elements 342 and upper spacer layer 930, respectively, by joining planar regions 1402 with bottom surface 941 of upper wafer 940. Material portions 1143 and 1131 may be photo-curable materials (e.g., by ultraviolet light), such that step 520 also includes curing material portions 1143 and 1131.

In step 530, method 500 stacks the upper wafer and the lower wafer such that at least a portion of the upper spacer layer is within the channel. Step 530 results in a stacked wafer. In an example of step 530, upper wafer assembly 900 and lower wafer assembly 600 are stacked to form a stacked-lens wafer 1200, shown in FIG. 12. Stacking upper wafer assembly 900 and lower wafer assembly 600 may include depositing an adhesive between upper spacer layer 930 and lower spacer layer 620, for example, on at least one of surfaces 624 and 931. In stacked-lens wafer 1200, a portion of each upper spacer layer 930 is within channel 626, that is, between two opposing sidewalls 625 of lower spacer layer 620.

Figure 12:
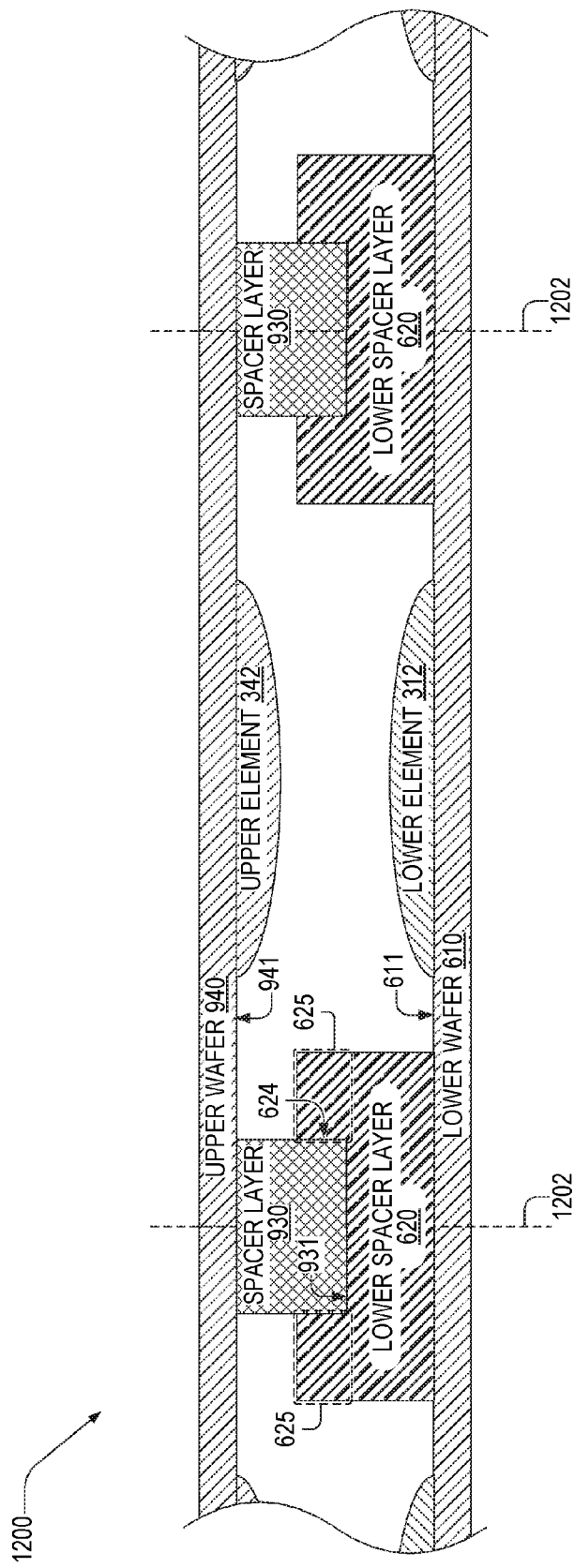
FIG. 12 is a cross-sectional view of a stacked-lens wafer formed by the method of FIG. 5, in an embodiment.

In a different example of step 530, upper wafer assembly 1000 and wafer assembly 700 are stacked to form a stacked-lens wafer that has a cross-section represented by FIG. 12, except that lower spacer layer 720 and upper spacer layer 1030 replace lower spacer layer 620 and upper spacer layer 930, respectively.

Step 540 is optional. In step 540, method 500 singulates the stacked-lens wafer along a plurality of dicing lines each between two opposing sidewalls of one respective inner spacer to form a plurality of stacked-lens assemblies. In an example of step 540, stacked-lens wafer 1200 is singulated along dicing lines 1202 between two opposing sidewalls 625 of lower spacer layer 620 to form a plurality of stacked-lens assemblies 300, FIG. 3. In a stacked-lens assembly 300 resulting from step 540, inner spacer 320 and outer spacer 330 are portions of lower spacer layer 620 and upper spacer layer 930, respectively, of FIG. 12. Dicing lines 1202 may correspond to dicing lines 602 and 902 of FIGS. 6A and 9A, respectively. Alternatively, Dicing lines 1202 may correspond to dicing lines 702 and 1002 of FIGS. 7 and 10, respectively.

Features described above as well as those claimed below may be combined in various ways without departing from the scope hereof. The following examples illustrate some possible, non-limiting combinations:

(A1) A stacked-lens assembly includes a lower substrate and an upper substrate. The lower substrate includes a lower-substrate top surface having thereon a lower element and an inner spacer, the inner spacer at least partially surrounding the lower element. The upper substrate includes an upper-substrate bottom surface opposite the lower-substrate top surface and having thereon an upper element and an outer spacer, the outer spacer (i) being attached to the inner spacer and (ii) at least partially surrounding the upper element. In any cross-section of the stacked-lens assembly parallel to the upper substrate and including both the inner spacer and the outer spacer, the entirety of the inner spacer is within a perimeter of the outer spacer.

(A2) The stacked-lens assembly denoted by (A1) may further include a gap between a top surface of the inner spacer and a region on the upper-substrate bottom surface directly thereabove.

(A3) In a stacked lens assembly denoted by one of (A1) and (A2), at least one of the lower element and the upper element may be a lens.

(A4) In a stacked lens assembly denoted by one of (A1) through (A3), the lower element and the upper element may be a lower lens and an upper lens respectively, such that the lower lens and upper lens are coaxial.

(A5) In a stacked lens assembly denoted by one of (A1) through (A4), one of the lower element and the upper element may be an image sensor.

(A6) In a stacked lens assembly denoted by one of (A1) through (A5), cross-section may be in a plane parallel to at least one of the lower substrate and the upper substrate.

(A7) In a stacked lens assembly denoted by one of (A1) through (A6), in a plane between the lower substrate and the upper substrate, the outer spacer may at least partially surround the inner spacer.

(A8) A stacked lens assembly denoted by one of (A1) through (A7) may further include an adhesive layer between the inner spacer and the outer spacer.

(B1) A stacked-lens wafer includes a lower wafer and an upper wafer. The lower wafer includes a lower-wafer top surface having thereon (i) a plurality of lower elements and (ii) a lower spacer layer having (a) a plurality of apertures aligned with one respective lower element, and (b) a channel between each adjacent aperture and at least partially surrounding each aperture. The upper wafer includes an upper-wafer bottom surface opposite the lower-wafer top surface and having thereon (i) a plurality of upper elements and (ii) an upper spacer layer having a plurality of apertures each aligned with one respective upper element. The upper wafer and the lower wafer are attached such that at least a portion of the upper spacer layer is within the channel.

(B2) In the stacked-lens wafer denoted by (B1), the channel may be a single continuous channel.

(C1) A method for fabricating a stacked-lens assembly includes forming, on a lower wafer, a lower spacer layer having (a) a plurality of apertures aligned with a respective one of a plurality of lower elements on the lower wafer, and (b) a channel between each adjacent aperture and at least partially surrounding each aperture. The method also includes forming, an upper spacer layer having a plurality of apertures each aligned with a respective one of a plurality of upper elements on the upper wafer. The method also includes stacking the upper wafer to the lower wafer such that at least a portion of the upper spacer layer is within the channel.

(C2) The method denoted by (C1) may further include a step of forming the plurality of lower elements on the lower wafer.

(C3) In the method denoted by (C2), the steps of (a) forming the lower spacer layer and (b) forming the plurality of lower elements may occur in a single step.

(C4) A method denoted by one of (C1) though (C3) may further include a step of forming the plurality of upper elements on the upper wafer.

(C5) In a method denoted by one of (C1) through (C4), the steps of (a) forming the upper spacer layer and (b) forming the plurality of upper elements may occur in a single step (C6) In a method denoted by one of (C1) through (C5), step of stacking may further include bonding the upper wafer with the lower wafer.

(C7) A method denoted by one of (C1) though (C6) wherein the step of stacking resulting in a stacked-lens wafer, the method may further include singulating the stacked-lens wafer along a plurality of dicing lines each between two opposing sidewalls of one respective inner spacer to form a plurality of stacked-lens assemblies.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A stacked-lens assembly comprising:
   a lower substrate with a lower-substrate top surface having thereon a lower element and an inner spacer, the inner spacer at least partially surrounding the lower element;
   an upper substrate with an upper-substrate bottom surface opposite the lower-substrate top surface and having thereon an upper element and an outer spacer that is (i) is attached to the inner spacer and (ii) at least partially surrounds the upper element,
   a portion of the inner spacer being between the lower substrate and a surface of the outer spacer closest to the lower substrate, and
   in any cross section of the stacked-lens assembly parallel to the upper substrate and including both a cross section of the inner spacer and a cross section of the outer spacer, the entirety of the cross section of the inner spacer is within an inner boundary of the cross section of the outer spacer.

2. The stacked-lens assembly of claim 1, further comprising a gap between a top surface of the inner spacer and a region on the upper-substrate bottom surface directly thereabove.

3. The stacked-lens assembly of claim 1, at least one of the lower element and the upper element being a lens.

4. The stacked-lens assembly of claim 1, the lower element and the upper element being a lower lens and an upper lens respectively, the lower lens and upper lens being coaxial.

5. The stacked-lens assembly of claim 1, one of the lower element and the upper element being an image sensor.

6. The stacked-lens assembly of claim 1, the cross section being in a plane parallel to at least one of the lower substrate and the upper substrate.

7. The stacked-lens assembly of claim 1, in a plane between the lower substrate and the upper substrate, the outer spacer at least partially surrounding the inner spacer.

8. The stacked-lens assembly of claim 1, further comprising an adhesive layer between the inner spacer and the outer spacer.

9. A stacked-lens wafer comprising:
   a lower wafer with a lower-wafer top surface having thereon (i) a plurality of lower elements and (ii) a lower spacer layer having (a) a plurality of apertures aligned with one respective lower element, and (b) a channel between each adjacent aperture and at least partially surrounding each aperture; and
   an upper wafer with an upper-wafer bottom surface opposite the lower-wafer top surface and having thereon (i) a plurality of upper elements and (ii) an upper spacer layer having a plurality of apertures each aligned with one respective upper element;
   the upper wafer and the lower wafer being attached, at least a portion of the upper spacer layer being within the channel such that, in any cross section of the stacked-lens wafer parallel to the upper wafer and including both a cross section of the lower spacer layer and a cross section of the upper spacer layer, the entirety of the cross section of the upper spacer layer is within an inner boundary of the cross section of the lower spacer layer.

10. The stacked-lens wafer of claim 9, the channel being a single continuous channel.

11. A method for fabricating a stacked-lens assembly comprising
    forming, on a lower wafer, a lower spacer layer having (a) a plurality of apertures aligned with a respective one of a plurality of lower elements on the lower wafer, and (b) a channel between each adjacent aperture and at least partially surrounding each aperture;
    forming, on an upper wafer, an upper spacer layer having a plurality of apertures each aligned with a respective one of a plurality of upper elements on the upper wafer; and
    stacking the upper wafer to the lower wafer such that at least a portion of the upper spacer layer is within the channel such that, in any cross section of the stacked-lens assembly parallel to the upper wafer and including both a cross section of the lower spacer layer and a cross section of the upper spacer layer, the entirety of the cross section of the upper spacer layer is within an inner boundary of the cross section of the lower spacer layer.

12. The method of claim 11, further comprising forming the plurality of lower elements on the lower wafer.

13. The method of claim 12, the steps of (a) forming the lower spacer layer and (b) forming the plurality of lower elements occurring in a single step.

14. The method of claim 11, further comprising forming the plurality of upper elements on the upper wafer.

15. The method of claim 14, the steps of (a) forming the upper spacer layer and (b) forming the plurality of upper elements occurring in a single step.

16. The method of claim 11, the step of stacking further comprising bonding the upper wafer with the lower wafer.

17. The method of claim 11, the step of stacking resulting in a stacked-lens wafer, and further comprising singulating the stacked-lens wafer along a plurality of dicing planes that intersect the channel.

* * * * *